United States Patent [19]
Onoda

[11] Patent Number: 6,040,583
[45] Date of Patent: Mar. 21, 2000

[54] ELECTRON BEAM EXPOSURE METHOD USING A MOVING STAGE

[75] Inventor: Naka Onoda, Tokyo, Japan

[73] Assignee: NEC Corporation, Tokyo, Japan

[21] Appl. No.: 09/083,095

[22] Filed: May 22, 1998

[30] Foreign Application Priority Data

May 22, 1997 [JP] Japan ................................. 9-131539

[51] Int. Cl.⁷ .............................................. H01J 37/302
[52] U.S. Cl. .............................. 250/492.22; 250/492.23; 250/398
[58] Field of Search .................. 250/492.22, 492.23, 250/398

[56] References Cited

U.S. PATENT DOCUMENTS 5,349,197  9/1994  Sakamoto et al. ............... 250/492.22

FOREIGN PATENT DOCUMENTS

63-127532  5/1988  Japan .
6-151287   5/1994  Japan .

Primary Examiner—Kiet T. Nguyen
Attorney, Agent, or Firm—Foley & Lardner

[57] ABSTRACT

An electron beam exposure system has a continuous stage drive for driving a stage at a constant speed. Area of a semiconductor chip is divided into an array of unit meshes to calculate pattern density in each mesh. A group of meshes having an equal density level is combined as a sub-strip region having dimensions equal to or lower than the maximum width determined based on the ability of the electron beam exposure system.

6 Claims, 8 Drawing Sheets

ELECTRON BEAM EXPOSURE METHOD USING A MOVING STAGE

BACKGROUND OF THE INVENTION (a) Field of the Invention

The present invention relates to a method for an electron beam exposure and, more particularly, to an electron beam exposure method for forming patterns directly on a semiconductor integrated circuit using a moving stage at a constant speed.

(b) Description of the Related Art

An electron beam exposure system generally comprises a continuous stage drive for driving the stage on which semiconductor wafers are mounted at a constant speed.

Figure 1A:
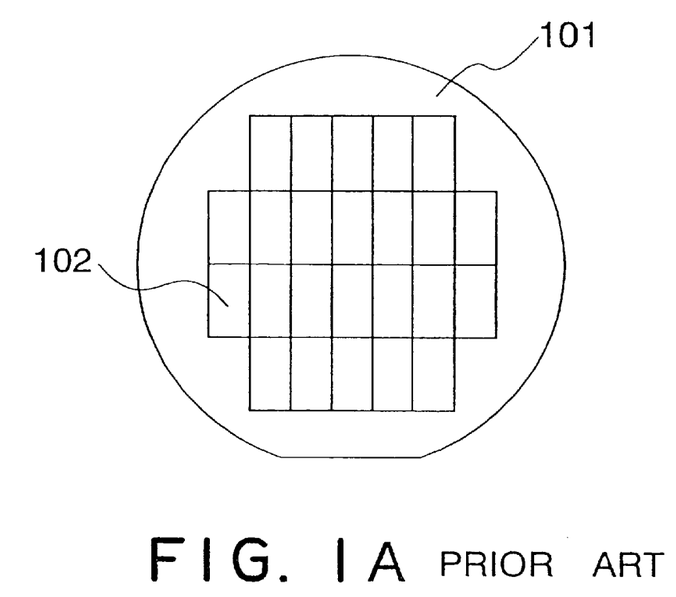
FIG. 1A is a top plan view of a typical object semiconductor wafer to be exposed by electron beam.
Figure 1B:
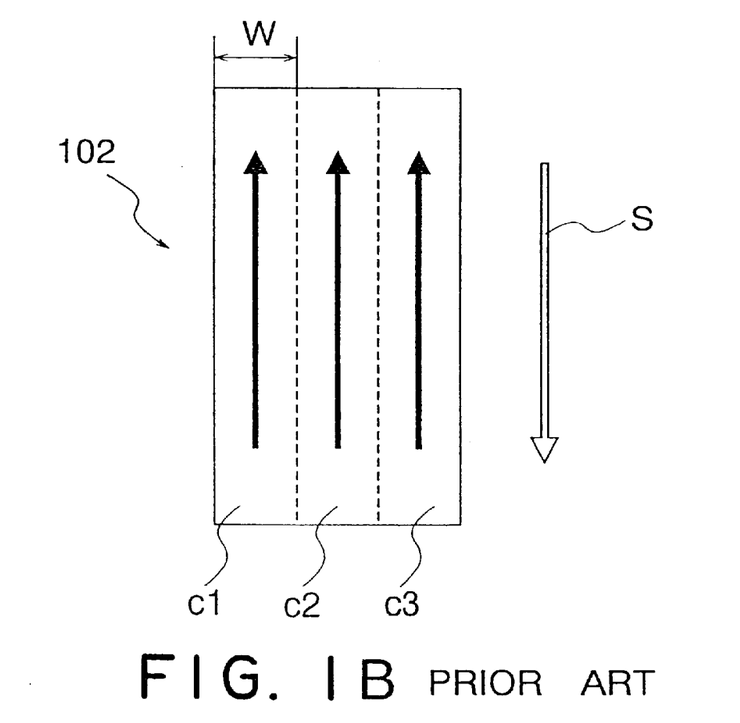
FIG. 1B is a top plan view of one of the chips in the semiconductor wafer of FIG. 1A, showing the direction of the movement of the stage and the electron beam exposure.

FIG. 1A shows a semiconductor wafer on which a plurality of chips are arranged for electron beam exposure by using an electron beam exposure system, and FIG. 1B shows the detail of one of the chip surfaces on the semiconductor wafer. In an electron exposure system using a continuous stage drive, the stage mounting thereon the semiconductor wafer 101 is continuously moved in X-direction at a constant speed and the electron beam is also shifted continuously in X-Y directions following the movement of the stage to form patterns on the chip 102.

During the normal patterning on the chip 102, the chip 102 is divided into a plurality of strip regions in Y-direction each corresponding to the width (W) of electron beam deflection, and patterns are consecutively formed in each strip region. The width W of the strip regions depends on the ability of the electron beam exposure unit which determines the dimensions for the electron beam deflection. If the width of the strip regions is set to exceed the deflection capability of the electron beam, pattern degradation will arise due to a large deflection distortion.

During the exposure, semiconductor wafer 101 is moved or shifted in the direction designated by arrow "S" (downward in the drawing). As a result, electron beam is moved relative to the semiconductor wafer in the direction designated by an arrow shown in each strip region (upward in the drawing), while deflected within the strip region in X-Y directions following the movement of the stage to form a desired pattern in each strip region. After a patterning is finished for one strip region, patterning in the next strip region follows by the movement of the stage. In this example, the patterning is conducted in the strip regions c1, c2 and c3 consecutively.

Figure 2:
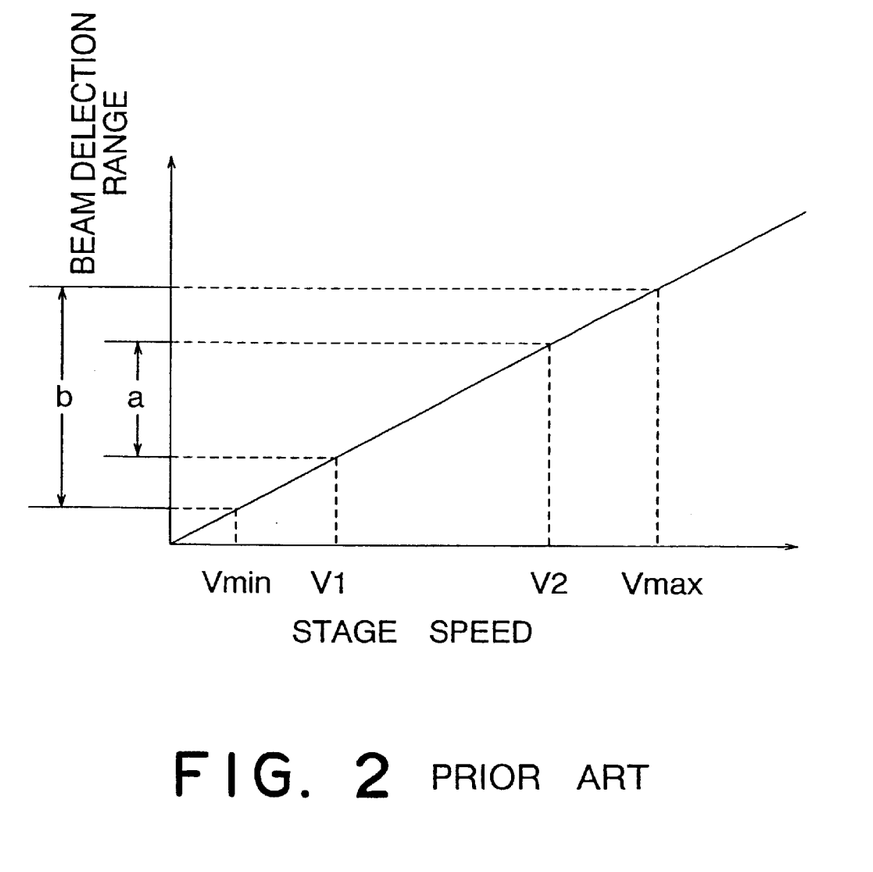
FIG. 2 is a graph of possible beam deflection range plotted against the stage speed in an exposure system.

FIG. 2 is a graph for showing a beam deflection width plotted against the stage speed. The stage can be moved at speeds between Vmin and Vmax during the exposure, which depend on the ability of the stage drive. On the other hand, to form a suitable pattern on the chip, a suitable deflection dimension or width of the electron beam resides within an optimum deflection range "a" in FIG. 2 depending on the ability of the beam deflection unit, which is lower than the maximum range "b" corresponding to the maximum speed Vmax and the minimum speed Vmin of the stage. Accordingly, the stage speed is practically limited between V1 and V2 corresponding to the optimum deflection range "a", in order to form desired patterns without deformation.

Figure 3A:
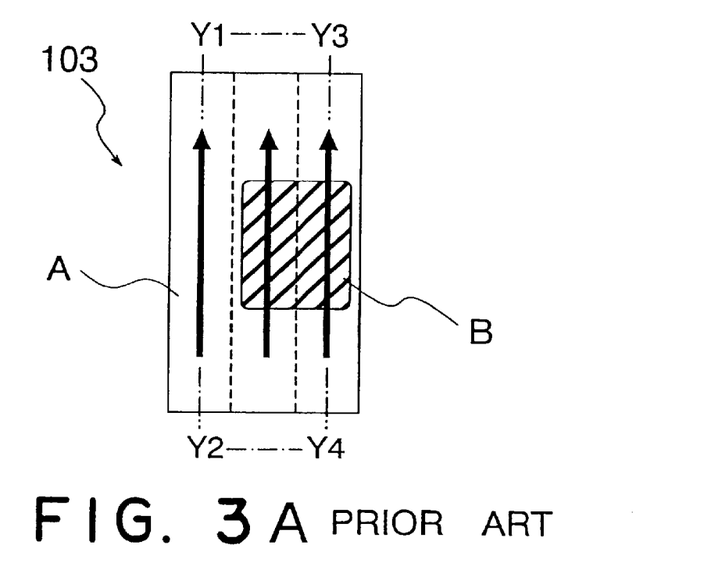
FIG. 3A is a top plan view of an example of chips having different pattern densities.
Figure 3B:
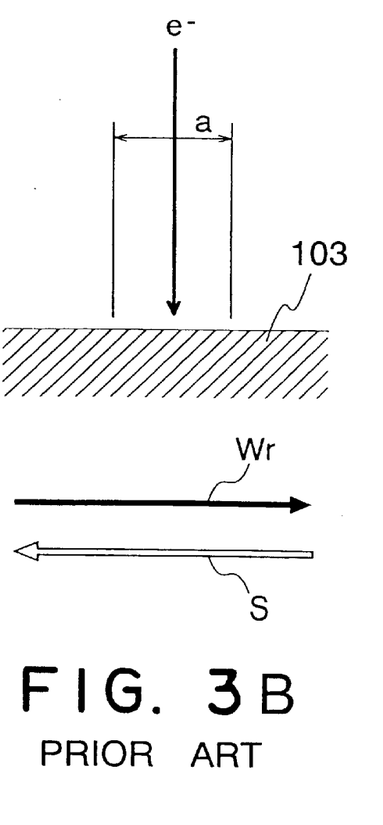
FIGS. 3B and 3C are schematic cross-sectional views taken along lines Y1-Y2 and Y3-Y4, respectively, during exposure by an electron beam.
Figure 3C:
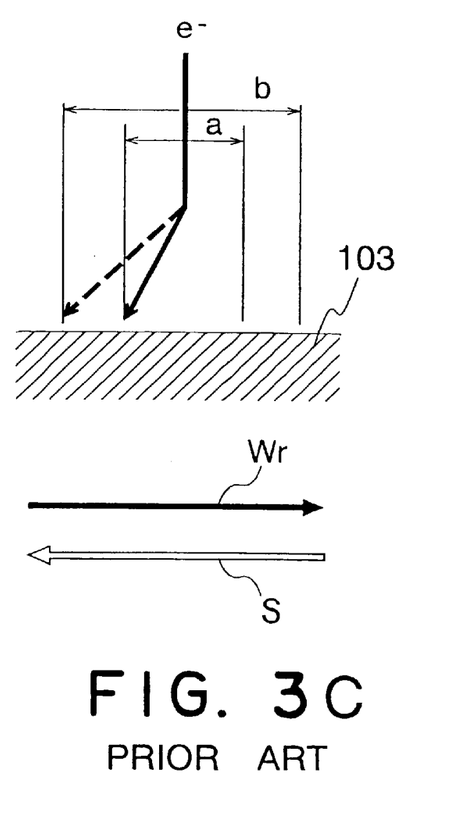

FIG. 3A shows an example of a chip which has an area "A" having a normal pattern density and an area "B" having a higher pattern density. The normal pattern density area "A" can be patterned by employing the stage speed between V1 and V2 and deflecting the electron beam within the optimum deflection range "a", as shown in FIG. 3B, without deformation. On the other hand, the high pattern density area "B" can be patterned without deformation by reducing the stage speed. However, if the reduced stage speed is below Vmin, the stage cannot be accurately controlled at a constant speed, which causes deformation in the resultant pattern. To avoid the stage speed below Vmin in this case, the deflection width of the electron beam deviates from the optimum deflection range "a", as shown in FIG. 3C, which also causes deformation in the resultant pattern. The low stage speed also reduces throughput of the electron beam exposure.

Patent Publication JP-A-6-151287 proposes an electron beam exposure system wherein patterns are classified into a plurality of groups having different pattern densities. In this case, the electron beam exposure for patterning of a single pattern having a high density is performed in a plurality of times by dividing the pattern into a plurality of sections. In this technique, electron beam deflection does not exceed maximum deflection width in the direction parallel to the movement of the stage. However, this technique cannot also employ an optimum stage speed for each of the pattern densities.

SUMMARY OF THE INVENTION

In view of the above, it is an object of the present invention to provide an electron exposure method using a continuous moving stage, which is capable of exposing a semiconductor chip with an electron beam for patterning without degradation of patterns and reduction of the throughput.

The present invention provides an electron beam exposure method comprising the steps of dividing a semiconductor chip into a plurality of sub-strip regions each having a width equal to or lower than a maximum width determined by an electron beam deflection range, at least two of the sub-strip regions having different widths, and consecutively exposing the plurality of sub-strip regions to form desired patterns on the semiconductor chip.

In accordance with the present invention, an optimum stage speed for electron beam exposure can be obtained without degradation of resultant patterns and reduction of the throughput.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings based on preferred embodiments thereof.

In the preferred embodiments of the present invention, an object semiconductor chip is divided into a plurality of regions for electron exposure before exposing the semiconductor chip for forming patterns thereon.

Figure 4:
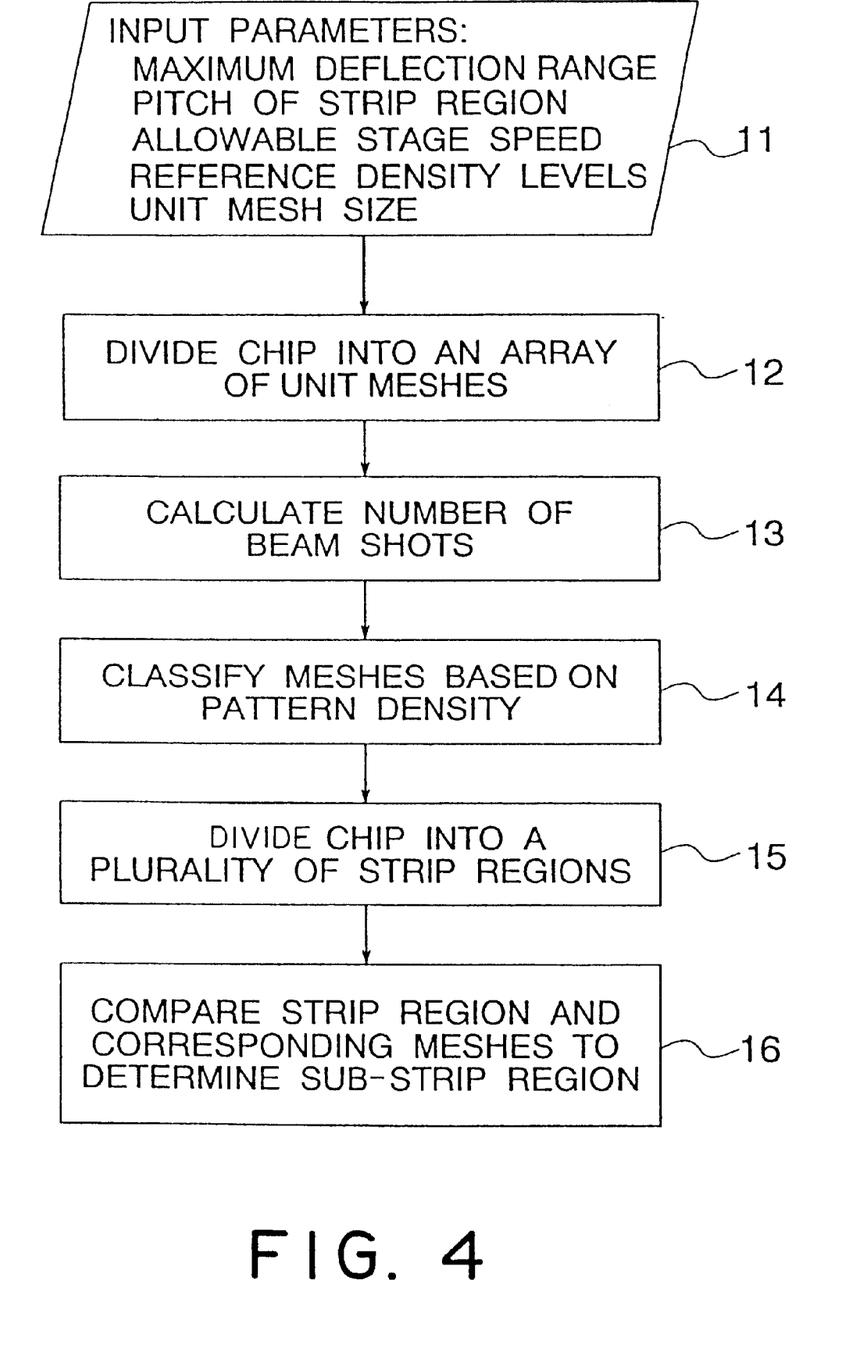
FIG. 4 is a flowchart showing a process for determining the electron deflection range based on the pattern density in an electron exposure method according to a first embodiment of the present invention.

Referring to FIG. 4, an electron beam exposure method according to a first embodiment of the present invention comprises consecutive steps 11 to 16. In step 11, parameters are input and stored for use in judging the pattern density and determining divided regions for the electron exposure. The stored parameters include a maximum range for electron beam deflection, a maximum pitch for division of the semiconductor chip, allowable maximum and minimum stage speeds, number of electron beam shots plotted against stage speeds, reference density levels used for determining the density level of a subject pattern and a corresponding optimum stage speed, and a unit mesh size for determining the pattern density in a unit mesh. The unit mesh size is determined so that the maximum range for electron deflection is an integral multiple of the unit mesh size.

Figure 5A:
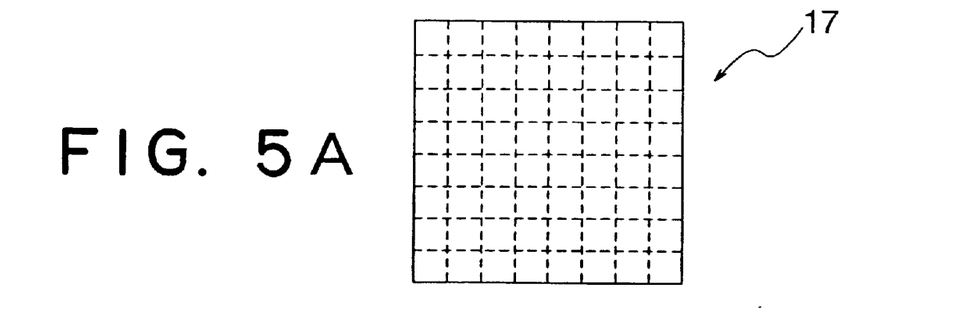
FIGS. 5A to 5D are top plan views of an exemplified chip for consecutively showing the stages of the chip divided by the process of FIG. 4.

In step 12, as shown in FIG. 5A, the illustrated area of an object semiconductor chip 17 is divided into an array of unit meshes or grids based on the unit mesh size stored. In step 13, the number of electron beam shots are calculated in each mesh based on the pattern to be formed in the each mesh.

Figure 5B:
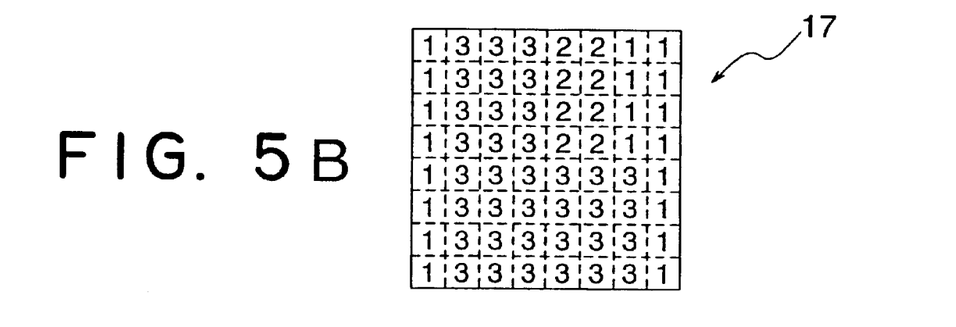

In step 14, the calculated numbers for the meshes are classified into a plurality (3, in this example) of groups based on the reference density levels stored in step 11. The classified groups includes class #1 of higher density, class #2 of middle density, and class #3 of normal or lower density and are stored as a table, such as a matrix shown in FIG. 5B, in a memory.

Figure 5C:
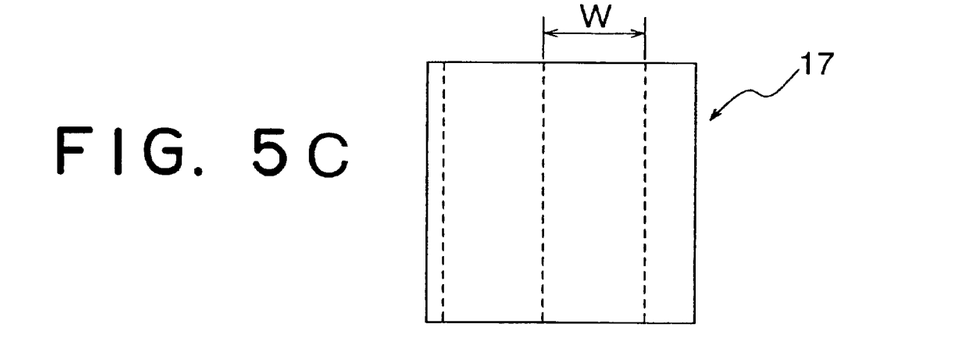

In step 15, the chip is divided into a plurality of strip regions based on the maximum range (W) of electron beam deflection, as shown in FIG. 5C.

In step 16, each strip region determined in step 15 and corresponding meshes stored in step 14 are compared against each other. If all the meshes in a strip region have an equal density class, the strip region is used for electron exposure provided that the width of the strip region does not exceed the optimum exposure range.

Figure 5D:
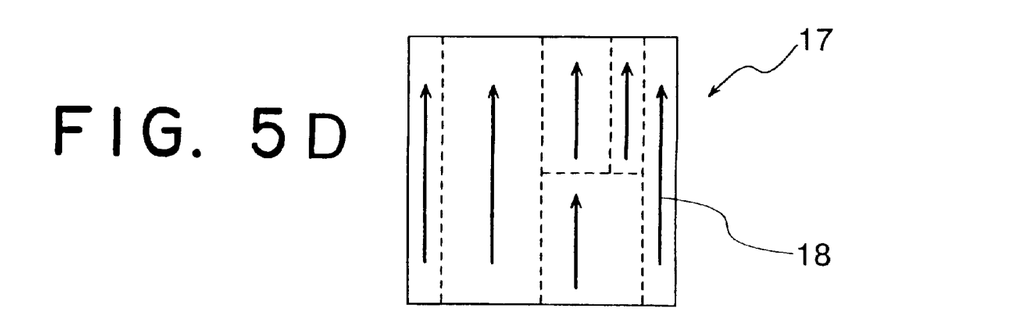

If the meshes having different class levels are disposed in a strip region, the strip region is further divided into a plurality of sub-strip region having a smaller width or length than the strip region so that the meshes having an equal class level are disposed in one sub-strip region and the electron beam deflection range corresponding to the optimum stage speed does not exceed the width of the sub-strip region, or so that the stage speed to be employed does not exceed the optimum stage speed for all of the meshes disposed in one strip region. In the example shown by FIG. 5D, meshes having an equal class level are disposed in one sub-strip region.

In an alternative, a small number of meshes having a class #3 may be mixed with a large number of meshes having class #2 in a single sub-strip region so long as the beam deflection range corresponding to the optimum stage speed does not exceed the width of the sub-strip region. In this case, the stage speed is adjusted for the meshes having class #2.

The sub-strip regions are stored in the memory, and are used for the electron exposure for the object chip. By employing the exposure process according to the first embodiment, the electron beam exposure can be performed in an electron beam exposure system having a continuous stage drive without a pattern degradation and a reduction of throughput.

Figure 6:
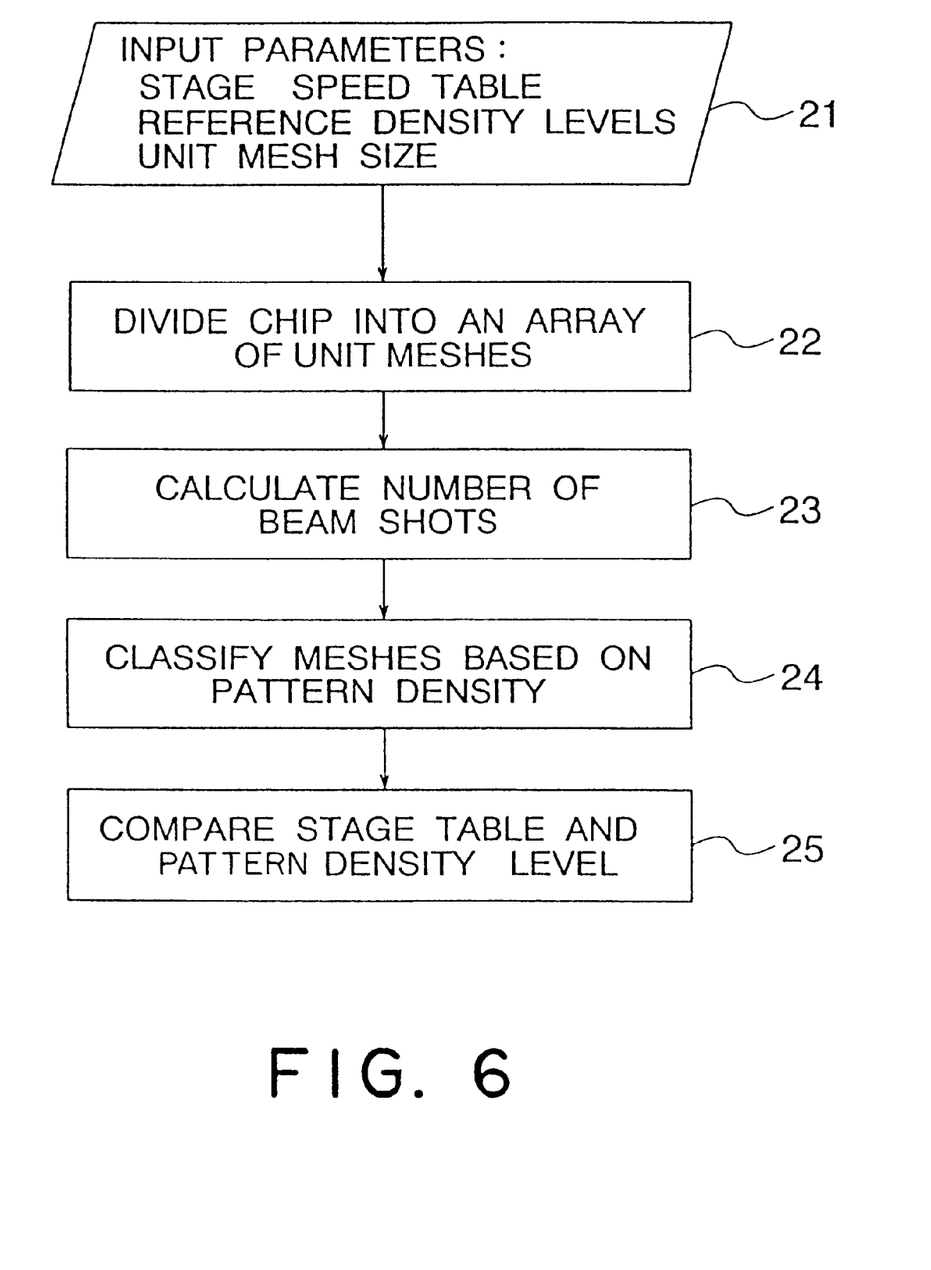
FIG. 6 is a flowchart showing a process for determining the electron deflection range based on the pattern density in an electron exposure method according to a second embodiment of the present invention.

Referring to FIG. 6, an electron beam exposure method according to a second embodiment of the present invention comprises consecutive steps 21 to 25. In step 21, parameters are input and stored in the electron beam exposure system. The parameters include a stage speed table, reference density levels used for determining the density level of a subject pattern and a corresponding optimum stage speed, and a unit mesh size for determining the pattern density in a unit mesh. The stage speed table may be as follows.

TABLE 1

| Number of beam shots | Stage speed | Beam deflection range ($\mu$m) |
| --- | --- | --- |
| Below 50 | Va | 5000 |
| 51–150 | Vb | 4500 |
| 151–250 | Vc | 4000 |
| — | — | — |
| Over 1000 | Vn | 500 |

In Table 1, number of beam shots are shown as a function of the stage speed and beam deflection range. The stage speed is determined in view of capability of equal stage speed, as follows. Test exposure is effected under a condition wherein the stage speed and the beam deflection range are determined at the maximum stage speed Va and the maximum range of 5000 $\mu$m, respectively. The maximum stage speed Va at which the stage can be moved at a constant speed without an exposure defect is determined at the number of shots being less 50. Then, the stage speed and the deflection range are increased and decreased, respectively, at a 10% pitch, wherein the number of shots in the test exposure is changed from 10 to 1000 at a constant pitch of 10 during the test exposure, to determine the stage speed Vb, Vc, . . . Vn at which the stage can be moved at a constant speed without a defect under the respective number of beam shots.

Steps 22 to 24 are similar to steps 12 to 14, respectively, in FIG. 4. In step 25, Table 1 stored in step 21 and the table for the pattern density level stored in step 24 are compared against each other to determine the width for electron beam exposure.

Figure 7:
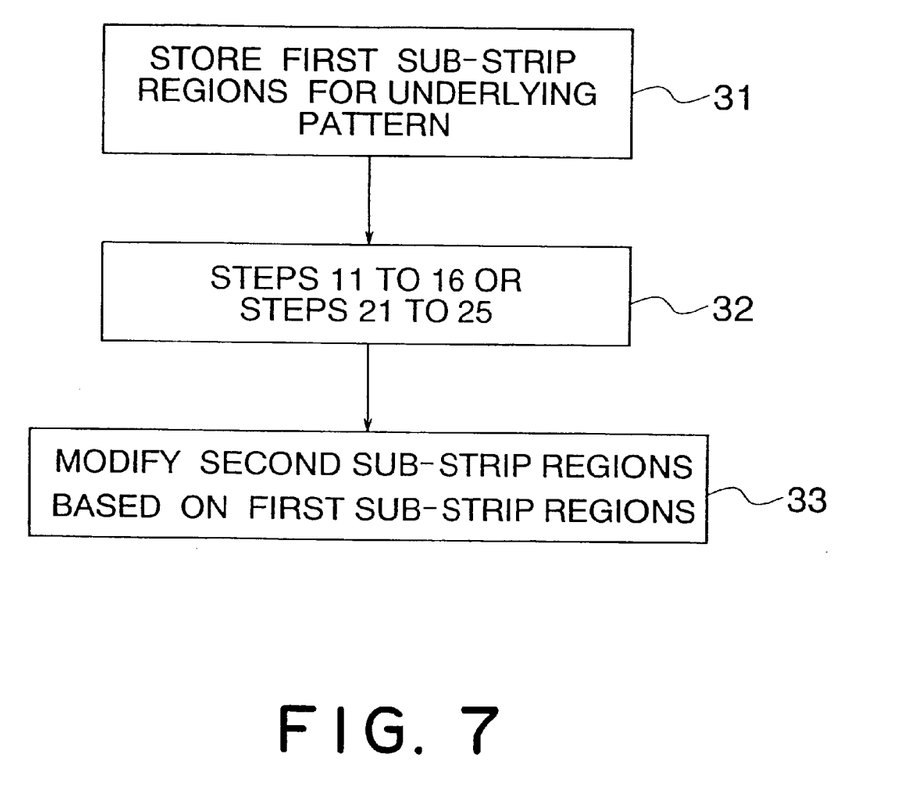
FIG. 7 is a flowchart of an electron exposure method according to a third embodiment of the present invention.

Referring to FIG. 7, an electron beam exposure process according to a third embodiment of the present invention comprises steps 31 to 33. In step 31, first sub-strip regions (or first strip regions) used in the exposure of an underlying pattern are stored. In step 32, steps 11 to 16 in the first embodiment or step 21 to 25 in the first embodiment are conducted to determine second sub-strip regions for a subject pattern.

In step 33, the second sub-strip regions determined in step 32 are compared against the first sub-strip regions used in the exposure for the underlying pattern to determine optimum sub-strip regions. The optimum sub-strip regions are basically determined by modifying the second sub-strip regions obtained in step 32 based on the first sub-strip regions in the underlying pattern.

Figure 8A:
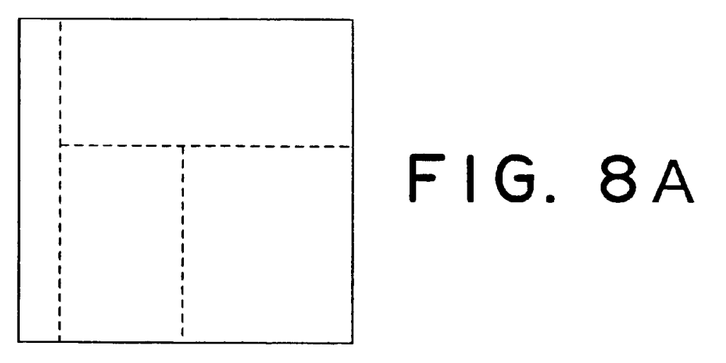
FIGS. 8A to 8C are top plan views of an exemplified chip for showing a division based on the electron beam exposure method of FIG. 7.
Figure 8B:
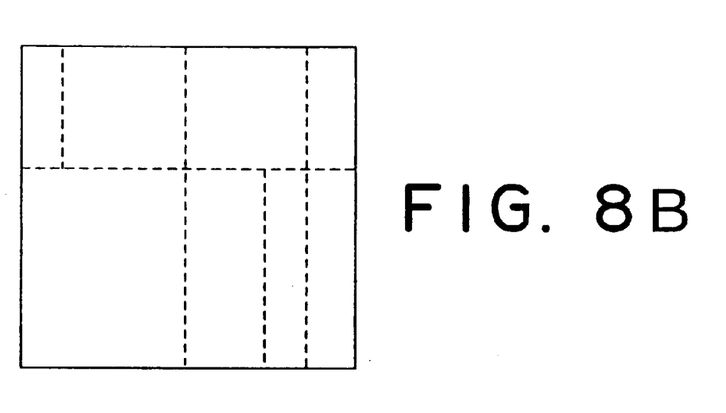
Figure 8C:
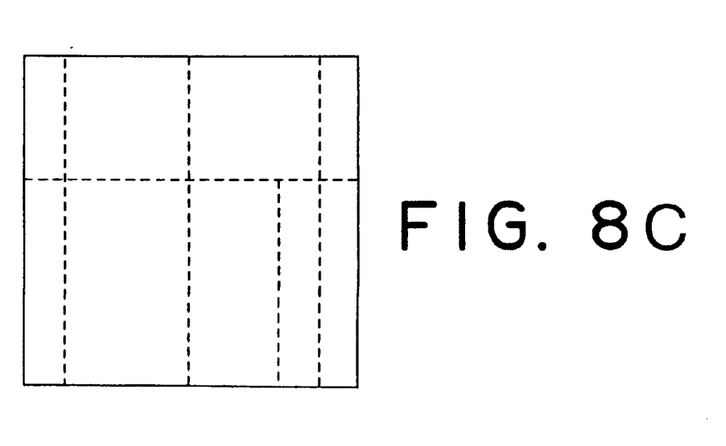

FIGS. 8A and 8B show the second sub-strip regions determined in step 32 and the first sub-strip regions in the underlying pattern, respectively. FIG. 8C shows the optimum sub-strip regions which are obtained by overlapping the first sub-strip regions with the second sub-strip regions.

Since the above embodiments are described only for examples, the present invention is not limited to the above embodiments and various modifications or alterations can be easily made therefrom by those skilled in the art without departing from the scope of the present invention.

What is claimed is:

1. An electron beam exposure method comprising the steps of:
    dividing a semiconductor chip into a plurality of sub-strip regions each having a width equal to or lower than a maximum width determined by an electron beam deflection range, at least two of said sub-strip regions having different widths; and
    consecutively exposing said plurality of sub-strip regions to form desired patterns on said semiconductor chip,
    wherein each said sub-strip region is modified based on sub-strip regions used in exposure during exposure for underlying patterns.

2. An electron beam exposure as defined in claim 1, wherein said maximum width is an multiple of said width of each said sub-strip region.

3. An electron beam exposure method comprising the steps of:
    dividing a semiconductor chip into a plurality of sub-strip regions each having a width equal to or lower than a maximum width determined by an electron beam deflection range, at least two of said sub-strips regions having different widths; and
    consecutively exposing said plurality of sub-strip regions to form desired patterns on said semiconductor chip,
    wherein said width of each sub-strip is determined based on a pattern density in said each sub-strip region.

4. An electron beam exposure method comprising the steps of:
    dividing a semiconductor chip into a plurality of sub-strip regions each having a width equal to or lower than a maximum width determined by an electron beam deflection range, at least two of said sub-strips regions having different widths;
    dividing the semiconductor chip into an array of unit meshes;
    calculating a pattern density level in each of said unit meshes; and
    consecutively exposing said plurality of sub-strip regions to form desired patterns on said semiconductor chip.

5. An electron beam exposure method as defined in claim 4, each said sub-strip region comprises at least one said unit mesh.

6. An electron beam exposure method as defined in claim 5 further comprising the step of controlling a stage speed based on the pattern density and the width.

* * * * *